(12) United States Patent
Yajima

(10) Patent No.: US 8,669,824 B2
(45) Date of Patent: *Mar. 11, 2014

(54) OSCILLATOR HAVING A PLURALITY OF SWITCHABLE MEMS VIBRATORS

(75) Inventor: Aritsugu Yajima, Matsumoto (JP)

(73) Assignee: Seiko Epson Corporation (JP)

( * ) Notice: Subject to any disclaimer, the term of this patent is extended or adjusted under 35 U.S.C. 154(b) by 38 days.

This patent is subject to a terminal disclaimer.

(21) Appl. No.: 13/422,323

(22) Filed: Mar. 16, 2012

(65) Prior Publication Data

US 2012/0235760 A1 Sep. 20, 2012

(30) Foreign Application Priority Data

Mar. 17, 2011 (JP) .................................. 2011-059214

(51) Int. Cl.
*H03B 5/30* (2006.01)
*H01L 41/00* (2013.01)
*H03H 9/205* (2006.01)

(52) U.S. Cl.
USPC .............. 331/162; 331/49; 331/56; 331/154; 331/179; 310/342; 333/189; 333/197

(58) Field of Classification Search
USPC .............. 310/342; 327/298; 331/46, 49, 56, 331/116 FE, 116 M, 116 R, 154, 158, 162, 331/179; 333/189, 197–199
See application file for complete search history.

(56) References Cited

U.S. PATENT DOCUMENTS

| | | | |
|---|---|---|---|
| 3,100,886 A * | 8/1963 | Marks | 367/137 |
| 3,614,667 A * | 10/1971 | Fletcher | 332/106 |
| 5,481,227 A * | 1/1996 | Komori et al. | 331/2 |
| 6,204,737 B1 * | 3/2001 | Ella | 333/187 |
| 6,809,604 B2 * | 10/2004 | Kawakubo et al. | 331/107 A |
| 6,933,794 B2 * | 8/2005 | Ogiso | 331/107 A |
| 6,936,491 B2 | 8/2005 | Partridge et al. | |
| 7,045,459 B2 | 5/2006 | Freidhoff | |
| 7,221,920 B2 * | 5/2007 | Abe et al. | 455/255 |
| 7,316,965 B2 | 1/2008 | Hooper et al. | |
| 7,352,040 B2 | 4/2008 | Partridge et al. | |
| 7,373,835 B2 | 5/2008 | Matsubara | |
| 7,402,907 B2 | 7/2008 | Ohguro | |
| 7,451,647 B2 | 11/2008 | Matsuhisa et al. | |
| 7,570,134 B2 | 8/2009 | Koji | |
| 7,638,429 B2 | 12/2009 | Freidhoff | |
| 7,755,454 B2 | 7/2010 | Tanaka et al. | |
| 7,875,941 B2 | 1/2011 | Freidhoff | |
| 7,894,205 B2 | 2/2011 | Lee et al. | |

(Continued)

FOREIGN PATENT DOCUMENTS

| JP | 62-47203 | * 2/1987 | H03B 5/32 |
|---|---|---|---|
| JP | 2005-086469 | 3/2005 | |

(Continued)

*Primary Examiner* — Levi Gannon
(74) *Attorney, Agent, or Firm* — Harness, Dickey & Pierce, P.L.C.

(57) ABSTRACT

An oscillation circuit includes a plurality of MEMS vibrators each having a first terminal and a second terminal, and having respective resonant frequencies different from each other, an amplifier circuit (an inverting amplifier circuit) having an input terminal and an output terminal, and a connection circuit adapted to connect the first terminal of one of the MEMS vibrators and the input terminal to each other, and the second terminal of the MEMS vibrator and the output terminal to each other to thereby connect the one of the MEMS vibrators and the amplifier circuit (the inverting amplifier circuit) to each other.

9 Claims, 12 Drawing Sheets

(56) References Cited

U.S. PATENT DOCUMENTS

| | | | |
|---|---|---|---|
| 7,977,757 B2 | 7/2011 | Yoshikawa et al. | |
| 7,994,594 B2 | 8/2011 | Inaba et al. | |
| 7,999,335 B2 | 8/2011 | Mikami et al. | |
| 8,035,176 B2 | 10/2011 | Jung et al. | |
| 8,305,152 B2 * | 11/2012 | Watanabe et al. | 331/154 |
| 2004/0227578 A1 * | 11/2004 | Hamalainen | 331/107 A |
| 2005/0275480 A1 * | 12/2005 | Nishio | 331/158 |
| 2007/0190680 A1 | 8/2007 | Fukuda et al. | |
| 2007/0296513 A1 * | 12/2007 | Ruile et al. | 331/116 R |
| 2008/0143450 A1 * | 6/2008 | Matsumoto et al. | 331/116 R |
| 2011/0281389 A1 | 11/2011 | Mikami et al. | |
| 2011/0303457 A1 | 12/2011 | Inaba et al. | |
| 2012/0262243 A1 | 10/2012 | Yajima | |
| 2013/0120074 A1 * | 5/2013 | Zuo et al. | 331/116 FE |

FOREIGN PATENT DOCUMENTS

| | | | |
|---|---|---|---|
| JP | 2005-142852 | 6/2005 | |
| JP | 2005-517546 | 6/2005 | |
| JP | 2005-212017 | 8/2005 | |
| JP | 2005-322666 | 11/2005 | |
| JP | 2006-050119 | * 2/2006 | H03B 5/30 |
| JP | 2006-211468 | 8/2006 | |
| JP | 2006-224220 | 8/2006 | |
| JP | 2006-321016 | 11/2006 | |
| JP | 2007-000994 | 1/2007 | |
| JP | 2007-114078 | 5/2007 | |
| JP | 2007-150736 | 6/2007 | |
| JP | 2007-210083 | 8/2007 | |
| JP | 2007-524995 | 8/2007 | |
| JP | 2007-281715 | 10/2007 | |
| JP | 2008-221435 | 9/2008 | |
| JP | 2008-277743 | 11/2008 | |
| JP | 2008-546553 | 12/2008 | |
| JP | 2009-064954 | 3/2009 | |
| JP | 2009-158485 | 7/2009 | |
| JP | 2009-160686 | 7/2009 | |
| JP | 2009-188785 | 8/2009 | |
| JP | 2010-021225 | 1/2010 | |
| JP | 2010-030020 | 2/2010 | |
| JP | 2010-056764 A | 3/2010 | |
| JP | 2010-511524 | 4/2010 | |

* cited by examiner

OSCILLATOR HAVING A PLURALITY OF SWITCHABLE MEMS VIBRATORS

BACKGROUND

1. Technical Field

The present invention relates to an oscillation circuit.

2. Related Art

Micro-electromechanical systems (MEMS) are one of microstructure formation technologies, and denote, for example, a technology of manufacturing a micron order of fine electronic machine system and products derived therefrom.

In JP-A-2006-224220, there is disclosed a MEMS vibrator having a stationary electrode and a movable electrode, and vibrating the movable electrode due to the electrostatic force generated between the both electrodes.

However, since the MEMS vibrator has a fine structure, the operating characteristics are significantly affected by the variation in the manufacturing process. For example, the MEMS vibrator vibrates at a predetermined frequency due to the drive of the movable electrode, and there is a case in which the shape (the length) of the movable electrode varies due to the variation in the manufacturing process, and thus, stable vibration characteristics (e.g., the frequency accuracy) fail to be obtained. Further, it is extremely difficult to perform trimming on the MEMS vibrator, which is manufactured using the semiconductor integrated circuit manufacturing technology, to thereby tune the frequency with accuracy equivalent to a quartz crystal vibrator.

SUMMARY

An advantage of some aspects of the invention is to provide an oscillation circuit of preventing the variation in the oscillation frequency using a MEMS vibrator.

An aspect of the invention is directed to an oscillation circuit including a plurality of MEMS vibrators each having a first terminal and a second terminal, and having respective resonant frequencies different from each other, an amplifier circuit having an input terminal and an output terminal, and a connection circuit adapted to connect the first terminal of one of the MEMS vibrators and the input terminal to each other, and the second terminal of the MEMS vibrator and the output terminal to each other to thereby connect the one of the MEMS vibrators and the amplifier circuit to each other.

"To connect" denotes "to connect electrically," and includes not only the case of connecting something in a direct-current manner, but also the case of connecting something in an alternating-current manner.

According to such an oscillation circuit, the MEMS vibrator used in the oscillation circuit can be selected using the connection circuit for connecting one of the MEMS vibrators having respective resonant frequencies different from each other and the amplifier circuit to each other. Thus, the MEMS vibrator with the resonant frequency closer to the target oscillation frequency can be selected even if the resonant frequency of the MEMS vibrator varies due to the variation in the manufacturing process. Therefore, the oscillation circuit with a suppressed variation in the oscillation frequency can be realized.

In the oscillation circuit of the above aspect of the invention, it is possible that the connection circuit includes at least one of a first switch adapted to switch a connection state between the first terminal of each of the MEMS vibrators and the input terminal, and a second switch adapted to switch a connection state between the second terminal of each of the MEMS vibrators and the output terminal.

The first switch and the second switch each have a configuration capable of switching at least the alternating-current connection state one or more times, and each can be formed of, for example, an analog switch or the like capable of switching the connection state many times, or a fuse or the like capable of switching the connection state only once.

According to such an oscillation circuit, by including at least one of the first switch and the second switch, the connection circuit for connecting one of the MEMS vibrators and the amplifier circuit to each other can easily be realized. By, for example, setting the state of at least one of the first switch and the second switch to the state of not making at least the alternating-current connection, it is possible to set the MEMS vibrator to the state in which it is not selected as the MEMS vibrator used in the oscillation circuit.

In the oscillation circuit of the above aspect of the invention, it is possible that the connection circuit includes the first switch, and the second switch.

According to such an oscillation circuit, it is possible to electrically separate other MEMS vibrators than the MEMS vibrator connected to the amplifier circuit by the connection circuit from both of the input terminal and the output terminal of the amplifier circuit. Thus, it can be prevented that the MEMS vibrators other than the MEMS vibrator connected to the amplifier circuit by the connection circuit become an unwanted load for the oscillation circuit.

In the oscillation circuit of any one of the above aspects of the invention, it is possible that the connection circuit connects the first terminal and the second terminal of the MEMS vibrator, which fails to be connected to the amplifier circuit, to a first reference potential.

According to such an oscillation circuit, by connecting the first terminal and the second terminal of the MEMS vibrator not connected to the amplifier circuit by the connection circuit to the first reference potential, it is possible to more surely separate the MEMS vibrator not connected to the amplifier circuit by the connection circuit electrically from both of the input terminal and the output terminal of the amplifier circuit. Thus, the MEMS vibrator not connected to the amplifier circuit by the connection circuit can be prevented from becoming a transmission source of a signal hindering the oscillation of the oscillation circuit.

In the oscillation circuit of the above aspect of the invention, it is possible that the connection circuit includes a third switch adapted to switch a connection state between the first terminal of the MEMS vibrator, which fails to be connected to the amplifier circuit, and the first reference potential, and a fourth switch adapted to switch a connection state between the second terminal of the MEMS vibrator, which fails to be connected to the amplifier circuit, and the first reference potential.

The third switch and the fourth switch each have a configuration capable of switching at least the alternating-current connection state one or more times, and each can be formed of, for example, an analog switch or the like capable of switching the connection state many times, or a fuse or the like capable of switching the connection state only once.

According to such an oscillation circuit, by setting the third switch and the fourth switch to the connected state, it is possible to more surely separate the MEMS vibrator not connected to the amplifier circuit by the connection circuit electrically from both of the input terminal and the output terminal of the amplifier circuit.

In the oscillation circuit of any one of the above aspects of the invention, it is possible to further include a first capacitor connected between the input terminal and a second reference potential, and a second capacitor connected between the output terminal and the second reference potential.

According to such an oscillation circuit it is possible to obtain the oscillation circuit having the resonant circuit composed of the MEMS vibrator thus selected, the first capacitor, and the second capacitor.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, some preferred embodiments of the invention will be described in detail with reference to the accompanying drawings. It should be noted that the embodiments described below do not unreasonably limit the content of the invention as set forth in the appended claims. Further, all of the constituents described below are not necessarily essential elements of the invention.

1. Oscillation Circuit According to First Embodiment

Figure 1:
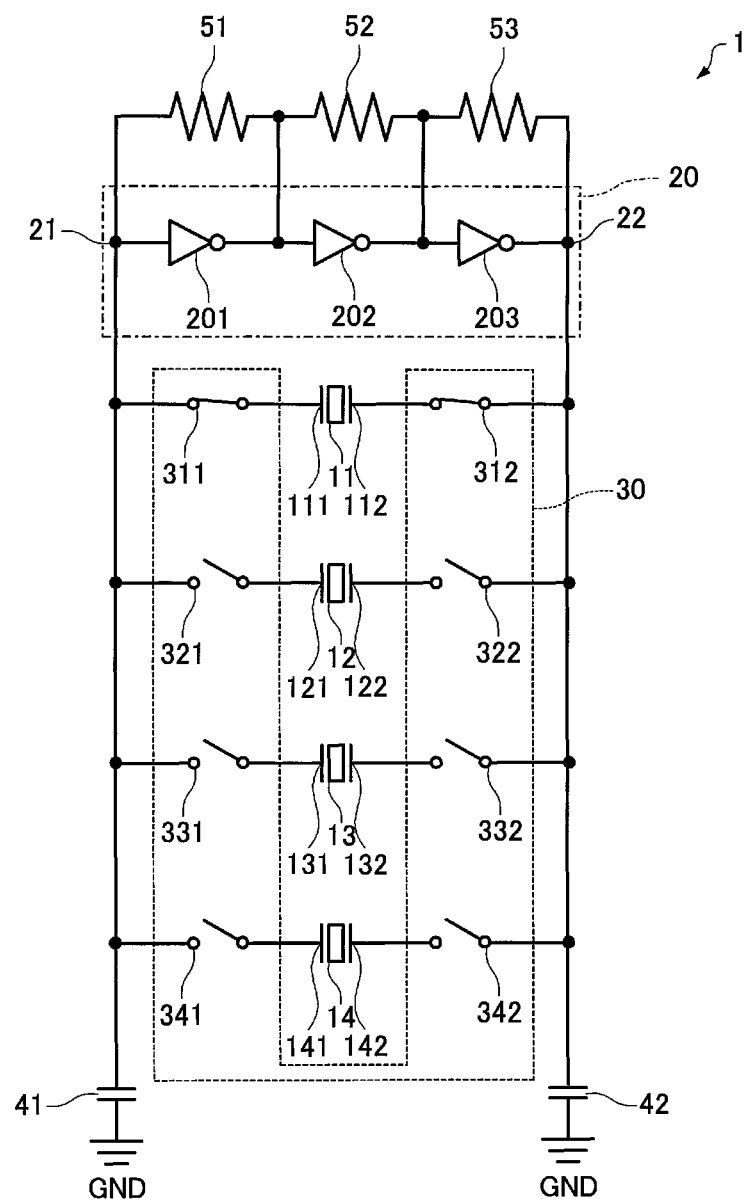
FIG. 1 is a circuit diagram showing an oscillation circuit according to a first embodiment of the invention.

FIG. 1 is a circuit diagram showing an oscillation circuit 1 according to a first embodiment of the invention. Hereinafter, the case in which a second reference potential is the ground potential GND will be explained as an example. Further, although a non-inverting amplifier circuit and an inverting amplifier circuit can be cited as an amplifier circuit, the inverting amplifier circuit is preferably used from a viewpoint of stability. In the explanation below, the case of using the inverting amplifier circuit is used as the amplifier circuit will be explained as an example.

The oscillation circuit 1 according to the first embodiment includes a plurality of MEMS vibrator 11 through 14 each having a first terminal and a second terminal, and having respective resonant frequencies different from each other, an inverting amplifier circuit 20 having an input terminal 21 and an output terminal 22, and a connection circuit 30 for connecting the input terminal 21 to the first terminal of one of the MEMS vibrators 11 through 14 and connecting the output terminal 22 to the second terminal of the same MEMS vibrator to thereby connect one of the MEMS vibrators 11 through 14 and the inverting amplifier circuit 20 to each other.

The MEMS vibrators 11 through 14 can also be, for example, an electrostatic MEMS vibrator or a piezoelectric MEMS vibrator. Further, the MEMS vibrators 11 through 14 can also be formed on the same substrate. In this case, the MEMS vibrators 11 through 14 can also be manufactured in the same manufacturing process. A configuration example of the MEMS vibrators 11 through 14 will be described in detail in the section of "7. Configuration Example Of MEMS Vibrator."

The number of MEMS vibrators included in the oscillation circuit 1 can arbitrarily be designed to be a natural number equal to or greater than 2. In the example shown in FIG. 1, the oscillation circuit 1 is configured including four MEMS vibrators 11 through 14. The MEMS vibrator 11 has the first terminal 111 and the second terminal 112. The MEMS vibrator 12 has the first terminal 121 and the second terminal 122. The MEMS vibrator 13 has the first terminal 131 and the second terminal 132. The MEMS vibrator 14 has the first terminal 141 and the second terminal 142.

The MEMS vibrators 11 through 14 have respective resonant frequencies different from each other. Assuming that, for example, the resonant frequency of the MEMS vibrator 11 is f1, the resonant frequency of the MEMS vibrator 12 is f2, the resonant frequency of the MEMS vibrator 13 is f3, and the resonant frequency of the MEMS vibrator 14 is f4, the MEMS vibrators 11 through 14 can also be configured so that the magnitude relation between the resonant frequencies f1 through f4 fulfills f2<f1<f3<f4. It is preferable to set the values of the frequencies f1 through f4 to the values close to each other to the extent that the accuracy to the target frequency required as the oscillation circuit is fulfilled by selecting either one of the MEMS vibrators 11 through 14 in consideration of, for example, the variation range of the frequency due to the manufacturing variation in the MEMS vibrators 11 through 14.

The inverting amplifier circuit 20 has the input terminal 21 and the output terminal 22. The inverting amplifier circuit 20 can also be configured by combining a plurality of inverters (inverting circuits) and amplifier circuits so that the desired oscillation conditions are fulfilled. In the example shown in FIG. 1, the inverting amplifier circuit 20 is composed of an inverter 201, an inverter 202, and an inverter 203 connected in series sequentially from the input terminal 21 toward the output terminal 22.

The oscillation circuit 1 can also be configured including a feedback resistor to the inverting amplifier circuit 20. In the example shown in FIG. 1, an input terminal and an output terminal of the inverter 201 are connected to each other via a resistor 51, an input terminal and an output terminal of the inverter 202 are connected to each other via a resistor 52, an input terminal and an output terminal of the inverter 203 are connected to each other via a resistor 53.

The connection circuit 30 connects the first terminal of one of the MEMS vibrators 11 through 14 to the input terminal 21, and connects the second terminal of the same MEMS vibrator to the output terminal 22 to thereby connect the one of the MEMS vibrators 11 through 14 and the inverting amplifier circuit 20 to each other. FIG. 1 shows the state in which the connection circuit 30 connects the MEMS vibrator 11 among the MEMS vibrators 11 through 14 and the inverting amplifier circuit 20 to each other. Hereinafter, the case in which the connection circuit 30 connects the MEMS vibrator 11 among the MEMS vibrators 11 through 14 and the inverting amplifier circuit 20 to each other will be explained as an example.

The first terminal 111 of the MEMS vibrator 11 connected to the inverting amplifier circuit 20 by the connection circuit 30 is connected to the input terminal 21 of the inverting amplifier circuit 20 at least in an alternating-current manner. In the example shown in FIG. 1, the first terminal 111 of the MEMS vibrator 11 is connected to the input terminal 21 of the inverting amplifier circuit 20 not only in an alternating-current manner, but also in a direct-current manner.

The second terminal 112 of the MEMS vibrator 11 connected to the inverting amplifier circuit 20 by the connection circuit 30 is connected to the output terminal 22 of the inverting amplifier circuit 20 at least in an alternating-current manner. In the example shown in FIG. 1, the second terminal 112 of the MEMS vibrator 11 is connected to the output terminal 22 of the inverting amplifier circuit 20 not only in an alternating-current manner, but also in a direct-current manner.

In the example shown in FIG. 1, the first terminal 121 of the MEMS vibrator 12 not connected to the inverting amplifier circuit 20 by the connection circuit 30 is not connected to the input terminal 21 of the inverting amplifier circuit 20 not only in an alternating-current manner, but also in a direct-current manner. The second terminal 122 of the MEMS vibrator 12 not connected to the inverting amplifier circuit 20 by the connection circuit 30 is not connected to the output terminal 22 of the inverting amplifier circuit 20 not only in an alternating-current manner, but also in a direct-current manner.

Further, in the example shown in FIG. 1, the first terminal 131 of the MEMS vibrator 13 not connected to the inverting amplifier circuit 20 by the connection circuit 30 is not connected to the input terminal 21 of the inverting amplifier circuit 20 not only in an alternating-current manner, but also in a direct-current manner. The second terminal 132 of the MEMS vibrator 13 not connected to the inverting amplifier circuit 20 by the connection circuit 30 is not connected to the output terminal 22 of the inverting amplifier circuit 20 not only in an alternating-current manner, but also in a direct-current manner.

Further, in the example shown in FIG. 1, the first terminal 141 of the MEMS vibrator 14 not connected to the inverting amplifier circuit 20 by the connection circuit 30 is not connected to the input terminal 21 of the inverting amplifier circuit 20 not only in an alternating-current manner, but also in a direct-current manner. The second terminal 142 of the MEMS vibrator 14 not connected to the inverting amplifier circuit 20 by the connection circuit 30 is not connected to the output terminal 22 of the inverting amplifier circuit 20 not only in an alternating-current manner, but also in a direct-current manner.

According to the oscillation circuit 1 of the first embodiment, the MEMS vibrator (the MEMS vibrator 11 in the example shown in FIG. 1) used in the oscillation circuit can be selected using the connection circuit 30 for connecting one of the MEMS vibrators 11 through 14 with respective resonant frequencies different from each other and the inverting amplifier circuit 20. Thus, the MEMS vibrator with the resonant frequency closer to the target oscillation frequency can be selected even if the resonant frequency of the MEMS vibrator varies due to the variation in the manufacturing process. Therefore, the oscillation circuit with a suppressed variation in the oscillation frequency can be realized.

The connection circuit 30 can include at least one of groups of switches, namely first switches 311, 321, 331, and 341 for switching the connection state between the first terminals of the MEMS vibrators 11 through 14 and the input terminal 21 of the inverting amplifier circuit 20, and second switches 312, 322, 332, and 342 for switching the connection state between the second terminals of the MEMS vibrators 11 through 14 and the output terminal 22 of the inverting amplifier circuit 20.

In the example shown in FIG. 1, the oscillation circuit 1 is configured including the first switch 311 for switching at least the alternating-current connection state between the first terminal 111 of the MEMS vibrator 11 and the input terminal 21 of the inverting amplifier circuit 20, the first switch 321 for switching at least the alternating-current connection state between the first terminal 121 of the MEMS vibrator 12 and the input terminal 21 of the inverting amplifier circuit 20, the first switch 331 for switching at least the alternating-current connection state between the first terminal 131 of the MEMS vibrator 13 and the input terminal 21 of the inverting amplifier circuit 20, and the first switch 341 for switching at least the alternating-current connection state between the first terminal 141 of the MEMS vibrator 14 and the input terminal 21 of the inverting amplifier circuit 20.

Further, in the example shown in FIG. 1, the oscillation circuit 1 is configured including the second switch 312 for switching at least the alternating-current connection state between the second terminal 112 of the MEMS vibrator 11 and the output terminal 22 of the inverting amplifier circuit 20, the second switch 322 for switching at least the alternating-current connection state between the second terminal 122 of the MEMS vibrator 12 and the output terminal 22 of the inverting amplifier circuit 20, the second switch 332 for switching at least the alternating-current connection state between the second terminal 132 of the MEMS vibrator 13 and the output terminal 22 of the inverting amplifier circuit 20, and the second switch 342 for switching at least the alternating-current connection state between the second terminal 142 of the MEMS vibrator 14 and the output terminal 22 of the inverting amplifier circuit 20.

In other words, in the example shown in FIG. 1, the connection circuit 30 is configured including the first switches and the second switches corresponding respectively to the MEMS vibrators 11 through 14.

The first switches 311, 321, 331, and 341 and the second switches 312, 322, 332, and 342 each have a configuration capable of switching at least the alternating-current connection state one or more times, and each can be formed of, for example, an analog switch or the like capable of switching the connection state many times, or a fuse or the like capable of switching the connection state only once.

Figure 2:
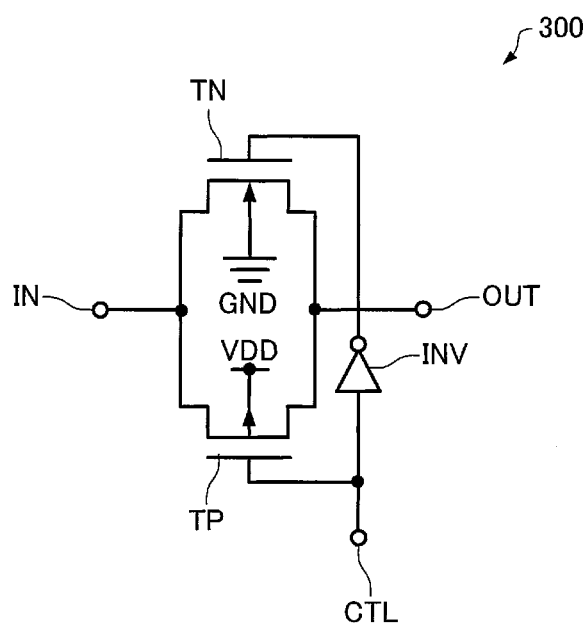
FIG. 2 is a circuit diagram showing a configuration example of an analog switch.

FIG. 2 is a circuit diagram showing a configuration example of an analog switch. The analog switch 300 is configured including an NMOS transistor TN and a PMOS transistor TP connected in parallel between an input terminal IN and an output terminal OUT. The back gate of the NMOS transistor TN is connected to the ground potential GND, and the back gate of the PMOS transistor TP is connected to the power-supply potential VDD as a positive potential. A control signal input from a control terminal CTL is input to the gate of the PMOS transistor, and at the same time, inverted by an inverter INV, and is then input to the gate of the NMOS transistor TN. Therefore, in the analog switch 300, a low-resistance state (i.e., the ON state of the switch) is made between the input terminal IN and the output terminal OUT by inputting the ground potential GND to the control terminal CTL as the control signal, and a high-resistance state (i.e., the OFF state of the switch) is made between the input terminal IN and the output terminal OUT by inputting the power-supply potential VDD to the control terminal CTL as the control signal. It should be noted that the switch which can be adopted to the oscillation circuit 1 is not limited thereto, but a variety of switches known to the public can be adopted.

According to the oscillation circuit 1 described above, by including at least one of the groups of switches, namely the first switches 311, 321, 331, and 341 and the second switches 312, 322, 332, and 342, the connection circuit 30 for connecting either one of the MEMS vibrators 11 through 14 and the inverting amplifier circuit 20 to each other can easily be realized. By, for example, setting the state of at least one of the first switch 311 and the second switch 312 to the state of not making at least the alternating-current connection, it is possible to set the MEMS vibrator 11 to the state in which it is not selected as the MEMS vibrator used in the oscillation circuit 1.

Further, as shown in FIG. 1, the connection circuit 30 can include both of the first switches 311, 321, 331, and 341, and the second switches 312, 322, 332, and 342.

According to the oscillation circuit 1 described above, the MEMS vibrators (the MEMS vibrators 12 through 14 in the example shown in FIG. 1) other than the MEMS vibrator (the MEMS vibrator 11 in the example shown in FIG. 1) connected to the inverting amplifier circuit 20 by the connection circuit 30 can electrically be separated from both of the input terminal 21 and the output terminal 22 of the inverting amplifier circuit 20. Thus, it can be prevented that the MEMS vibrators other than the MEMS vibrator connected to the inverting amplifier circuit 20 by the connection circuit 30 become an unwanted load for the oscillation circuit 1.

The oscillation circuit 1 can be configured including a first capacitor 41 connected between the input terminal 21 of the inverting amplifier circuit 20 and the second reference potential (the ground potential GND), and a second capacitor 42 connected between the output terminal 22 of the inverting amplifier circuit 20 and the second reference potential (the ground potential GND).

According to the oscillation circuit 1 described above, an oscillation circuit having a resonant circuit composed of the MEMS vibrator (the MEMS vibrator 11 in the example shown in FIG. 1) connected to the inverting amplifier circuit 20 by the connection circuit 30, the first capacitor 41, and the second capacitor 42 can be obtained.

2. Oscillation Circuit According to Second Embodiment

Figure 3:
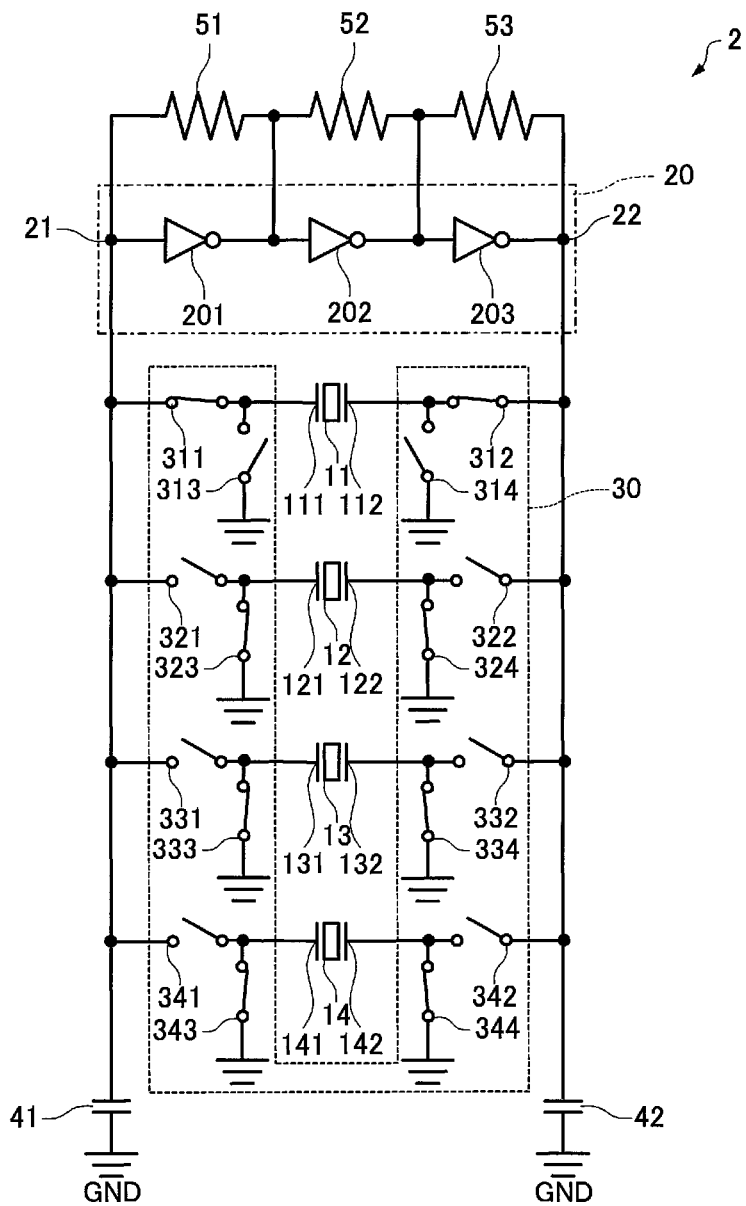
FIG. 3 is a circuit diagram showing an oscillation circuit according to a second embodiment of the invention.

FIG. 3 is a circuit diagram showing an oscillation circuit 2 according to a second embodiment of the invention. Hereinafter, the constituents different from those of the oscillation circuit 1 according to the first embodiment will be described in detail, and the constituents substantially the same as those of the oscillation circuit 1 according to the first embodiment will be denoted by the same reference numerals, and the explanation therefor will be omitted. Further, the case in which the first reference potential is the ground potential GND will hereinafter be explained as an example.

In the oscillation circuit 2 according to the second embodiment, the connection circuit 30 is configured so as to connect the first terminals and the second terminals of the MEMS vibrators (the MEMS vibrators 12 through 14 in the example shown in FIG. 3) not connected to the inverting amplifier circuit 20 to the first reference potential (the ground potential GND).

Further, in the example shown in FIG. 3, the first terminal 111 and the second terminal 112 of the MEMS vibrator 11 connected to the inverting amplifier circuit 20 by the connection circuit 30 are configured so as not to be connected to the first reference potential (the ground potential GND).

In the example shown in FIG. 3, the MEMS vibrators 12 through 14 are electrically separated from the inverting amplifier circuit 20 if the first switches 321, 331, and 341 and the second switches 322, 332, and 342 are ideal switches. However, in the actual switches, it is extremely difficult to completely cut off in particular the alternating-current signal.

According to the oscillation circuit 2 of the second embodiment, by connecting the first terminals and the second terminals of the MEMS vibrators (the MEMS vibratos 12 through 14 in the example shown in FIG. 3) not connected to the inverting amplifier circuit 20 by the connection circuit 30 to the first reference potential (the ground potential GND), the MEMS vibrators 12 through 14 not connected to the inverting amplifier circuit 20 by the connection circuit 30 can more surely be separated electrically from both of the input terminal 21 and the output terminal 22 of the inverting amplifier circuit 20. Thus, the MEMS vibrators not connected to the inverting amplifier circuit 20 by the connection circuit 30 can be prevented from becoming a transmission source of a signal hindering the oscillation of the oscillation circuit.

As shown in FIG. 3, the connection circuit 30 can be configured including third switches 313, 323, 333, and 343 for switching the connection state between the first terminals of the MEMS vibrators not connected to the inverting amplifier circuit 20 and the first reference potential (the ground potential GND), and fourth switches 314, 324, 334, and 344 for switching the connection state between the second terminals of the MEMS vibrators not connected to the inverting amplifier circuit 20 and the first reference potential (the ground potential GND).

In the example shown in FIG. 3, the oscillation circuit 2 is configured including the third switch 313 for switching the connection state between the first terminal 111 of the MEMS vibrator 11 and the ground potential GND, the third switch 323 for switching the connection state between the first terminal 121 of the MEMS vibrator 12 and the ground potential GND, the third switch 333 for switching the connection state between the first terminal 131 of the MEMS vibrator 13 and the ground potential GND, and the third switch 343 for switching the connection state between the first terminal 141 of the MEMS vibrator 14 and the ground potential GND.

Further, in the example shown in FIG. 3, the oscillation circuit 2 is configured including the fourth switch 314 for switching the connection state between the second terminal 112 of the MEMS vibrator 11 and the ground potential GND, the fourth switch 324 for switching the connection state between the second terminal 122 of the MEMS vibrator 12 and the ground potential GND, the fourth switch 334 for switching the connection state between the second terminal 132 of the MEMS vibrator 13 and the ground potential GND, and the fourth switch 344 for switching the connection state between the second terminal 142 of the MEMS vibrator 14 and the ground potential GND.

In other words, in the example shown in FIG. 3, the connection circuit 30 is configured including the third switches and the fourth switches corresponding respectively to the MEMS vibrators 11 through 14.

The third switches 313, 323, 333, and 343 and the fourth switches 314, 324, 334, and 344 each have a configuration capable of switching the connection state one or more times, and each can be formed of, for example, an analog switch or the like capable of switching the connection state many times, or a fuse or the like capable of switching the connection state only once. As the analog switches, the analog switch 300 shown in FIG. 2, for example, can be adopted. It should be noted that the switch which can be adopted to the oscillation circuit 2 is not limited thereto, but a variety of switches known to the public can be adopted.

According to the oscillation circuit 2 described above, by setting the third switches and the fourth switches to the "connected" state, the MEMS vibrators (the MEMS vibrators 12 through 14 in the example shown in FIG. 3) not connected to the inverting amplifier circuit 20 by the connection circuit 30 can more surely be separated electrically from both of the input terminal 21 and the output terminal 22 of the inverting amplifier circuit 20.

Further, the oscillation circuit 2 according to the second embodiment provides advantages substantially the same as those of the oscillation circuit 1 according to the first embodiment in addition to the advantages described above.

Figure 4:
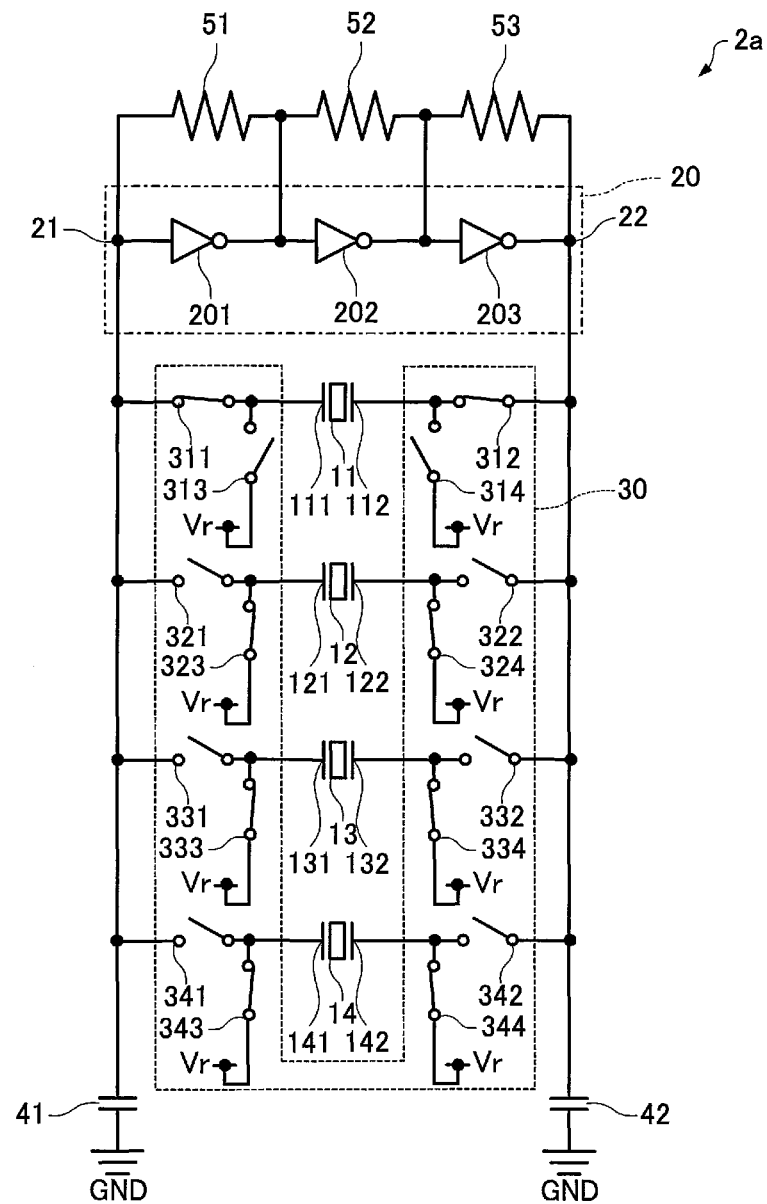
FIG. 4 is a circuit diagram showing an oscillation circuit according to a first modified example of the second embodiment.

2-1. Oscillation Circuit According to First Modified Example of Second Embodiment FIG. 4 is a circuit diagram showing an oscillation circuit 2a according to a first modified example of the second embodiment. The oscillation circuit 2a is different from the oscillation circuit 2 in the point that the first reference potential is a reference potential Vr. As the reference potential Vr, there can be adopted an arbitrary potential such as the power-supply potential VDD to be supplied to the oscillation circuit 2a or a bias potential supplied for operating the MEMS vibrators 11 through 14.

Also in the oscillation circuit 2a according to the first modified example of the second embodiment, substantially the same advantages can be obtained for substantially the same reason as in the oscillation circuit 2 according to the second embodiment.

It should be noted that the reference potential Vr is not required to be a potential specified by the design. It is also possible to, for example, electrically connect the first terminal and the second terminal of each of the MEMS vibrators (the MEMS vibrators 12 through 14 in the example shown in FIG. 4) not connected to the inverting amplifier circuit 20 by the connection circuit 30 to each other via one or more switches. In the example shown in FIG. 4, there is adopted a configuration equivalent to the case in which the first terminal and the second terminal of each of the MEMS vibrators not connected to the inverting amplifier circuit 20 by the connection circuit 30 are electrically connected to each other via the two switches. In other words, various modifications capable of setting the first terminal and the second terminal of each of the MEMS vibrators not connected to the inverting amplifier circuit 20 by the connection circuit 30 to the same potential can be made with respect to the oscillation circuit 2 according to the second embodiment.

Figure 5:
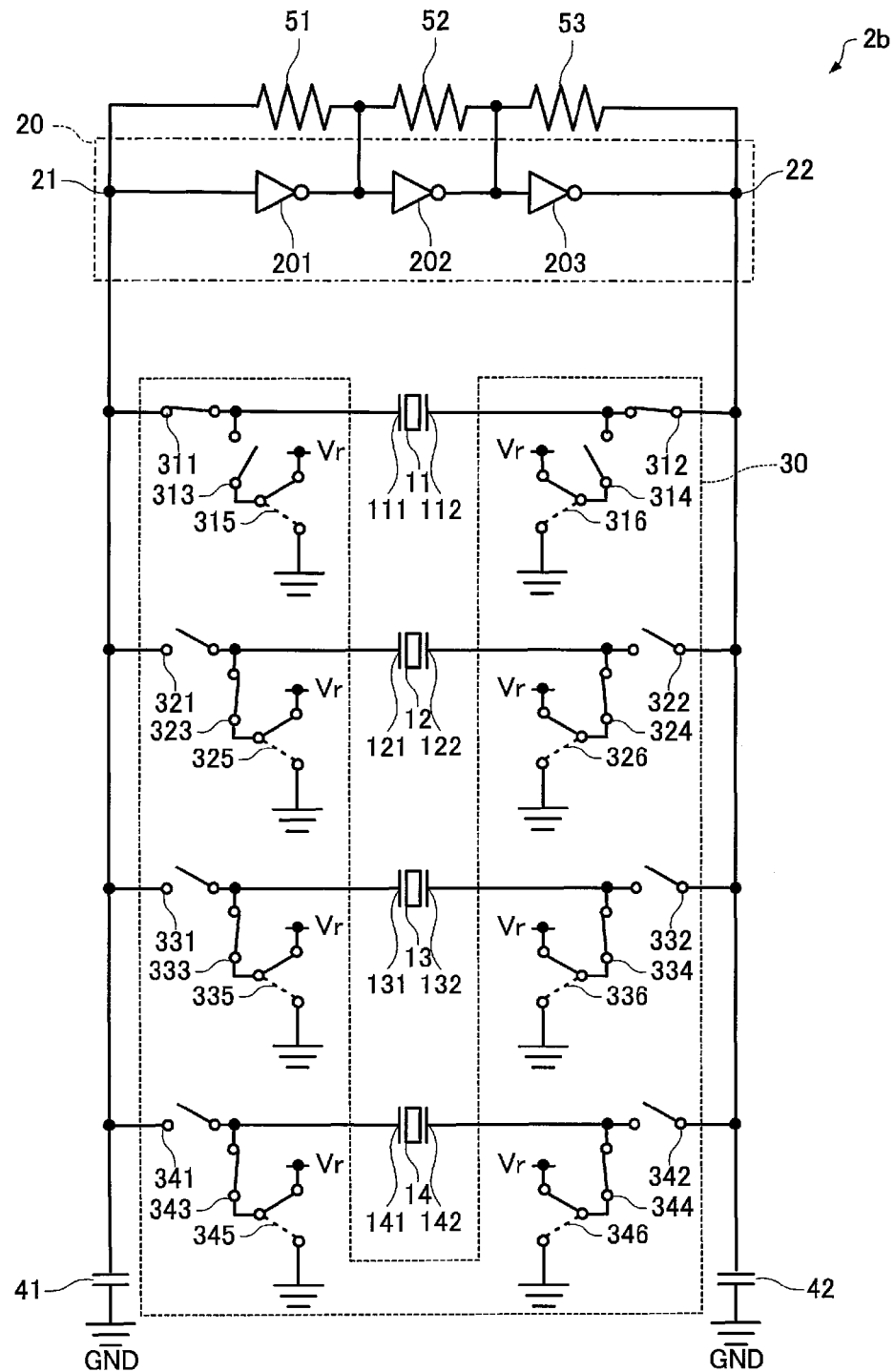
FIG. 5 is a circuit diagram showing an oscillation circuit according to a second modified example of the second embodiment.

2-2. Oscillation Circuit According To Second Modified Example of Second Embodiment FIG. 5 is a circuit diagram showing an oscillation circuit 2b according to a second modified example of the second embodiment. The oscillation circuit 2b is different from the oscillation circuit 2 in the point that fifth switches 315, 325, 335, and 345, and sixth switches 316, 326, 336, and 346 for selecting the first reference potential are provided.

In the example shown in FIG. 5, one ends of the fifth switches 315, 325, 335, and 345 are electrically connected sequentially to one ends of the third switches 313, 323, 333, and 343, and the other ends of the fifth switches 315, 325, 335, and 345 are each configured as a changeover switch for selecting either one of the ground potential GND and the reference potential Vr as the first reference potential.

Further, in the example shown in FIG. 5, one ends of the sixth switches 316, 326, 336, and 346 are electrically connected sequentially to one ends of the fourth switches 314, 324, 334, and 344, and the other ends of the sixth switches 316, 326, 336, and 346 are each configured as a changeover switch for selecting either one of the ground potential GND and the reference potential Vr as the first reference potential.

The fifth switches 315, 325, 335, and 345 and the sixth switches 316, 326, 336, and 346 can be composed of a combination of the analog switches shown in FIG. 2.

The connection state of the fifth switches 315, 325, 335, and 345 and the sixth switches 316, 326, 336, and 346 is a connection state in which the first terminal and the second terminal of each of the MEMS vibrators not connected to the inverting amplifier circuit 20 by the connection circuit 30 are set to the same electrical potential. In the example shown in FIG. 5, if the reference potential Vr is selected as the first reference potential by the fifth switches 315, 325, 335, and 345, the sixth switches 316, 326, 336, and 346 also select the reference potential Vr as the first reference potential. Similarly, if the ground potential GND is selected as the first reference potential by the fifth switches 315, 325, 335, and 345, the sixth switches 316, 326, 336, and 346 also select the ground potential GND as the first reference potential.

Also in the oscillation circuit 2b according to the second modified example of the second embodiment, substantially the same advantages can be obtained for substantially the same reason as in the oscillation circuit 2 according to the second embodiment.

3. Oscillation Circuit According to Third Embodiment

Figure 6:
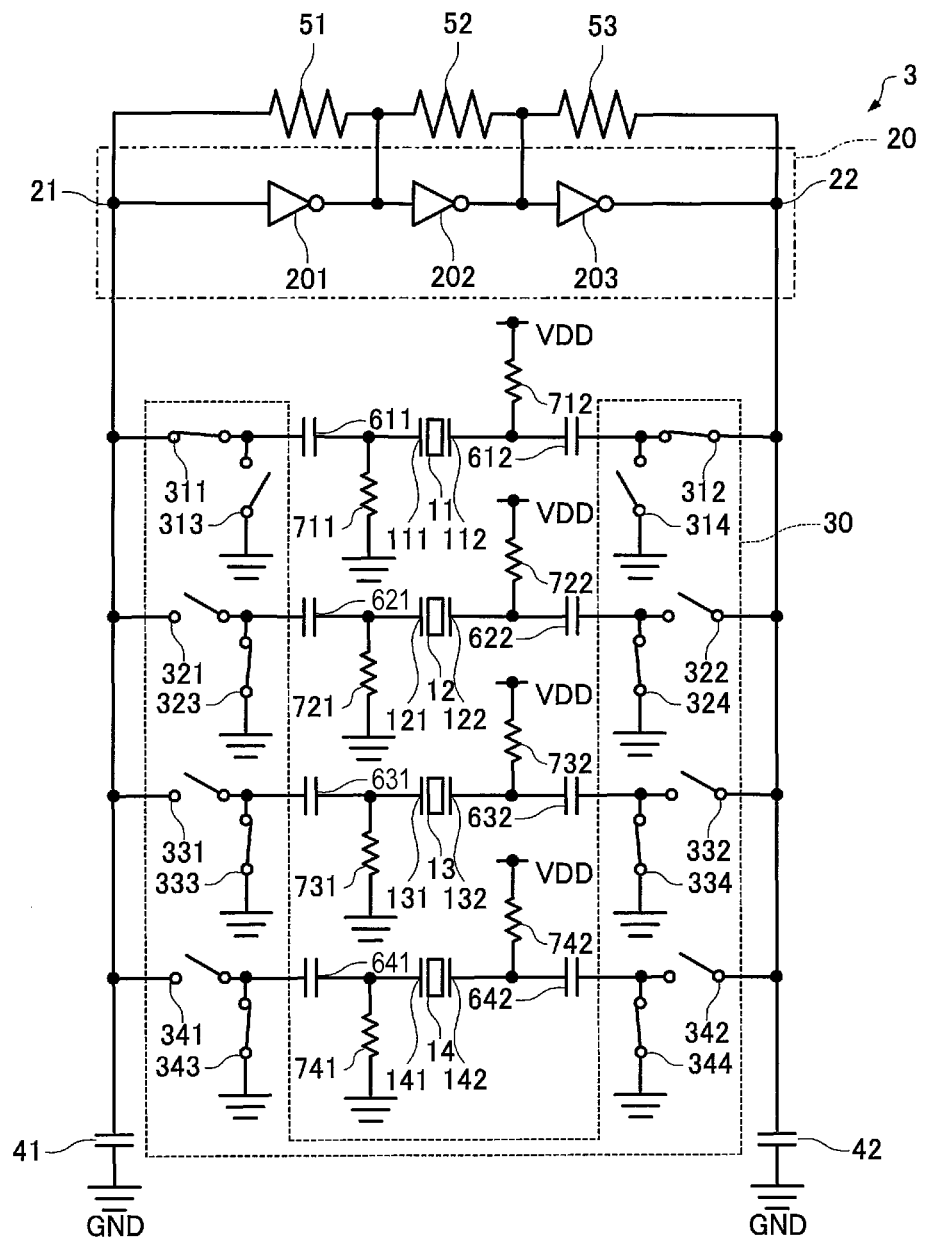
FIG. 6 is a circuit diagram showing an oscillation circuit according to a third embodiment of the invention.

FIG. 6 is a circuit diagram showing an oscillation circuit 3 according to a third embodiment of the invention. Hereinafter, the constituents different from those of the oscillation circuit 1 according to the first embodiment and the oscillation circuit 2 according to the second embodiment will be described in detail, and the constituents substantially the same as those of the oscillation circuit 1 according to the first embodiment or the oscillation circuit 2 according to the second embodiment will be denoted by the same reference numerals, and the explanation therefor will be omitted.

The oscillation circuit 3 according to the third embodiment is different from the oscillation circuit 2 according to the second embodiment in the point that the first terminal of the MEMS vibrator connected to the inverting amplifier circuit 20 by the connection circuit 30 is connected to the input terminal 21 of the inverting amplifier circuit 20 via a capacitor, and the second terminal of the MEMS vibrator connected to the inverting amplifier circuit 20 by the connection circuit 30 is connected to the output terminal 22 of the inverting amplifier circuit 20 via a capacitor.

In the example shown in FIG. 6, if the MEMS vibrator 11 is connected to the inverting amplifier circuit 20 by the connection circuit 30, the first terminal 111 of the MEMS vibrator 11 is connected to the input terminal 21 of the inverting amplifier circuit 20 via the capacitor 611, and the second terminal 112 of the MEMS vibrator 11 is connected to the output terminal 22 of the inverting amplifier circuit 20 via the capacitor 612. Similarly, if the MEMS vibrator 12 is connected to the inverting amplifier circuit 20 by the connection circuit 30, the first terminal 121 of the MEMS vibrator 12 is connected to the input terminal 21 of the inverting amplifier circuit 20 via the capacitor 621, and the second terminal 122 of the MEMS vibrator 12 is connected to the output terminal 22 of the inverting amplifier circuit 20 via the capacitor 622. Further, if the MEMS vibrator 13 is connected to the inverting amplifier circuit 20 by the connection circuit 30, the first terminal 131 of the MEMS vibrator 13 is connected to the input terminal 21 of the inverting amplifier circuit 20 via the capacitor 631, and the second terminal 132 of the MEMS vibrator 13 is connected to the output terminal 22 of the inverting amplifier circuit 20 via the capacitor 632. Further, if the MEMS vibrator 14 is connected to the inverting amplifier circuit 20 by the connection circuit 30, the first terminal 141 of the MEMS vibrator 14 is connected to the input terminal 21 of the inverting amplifier circuit 20 via the capacitor 641, and the second terminal 142 of the MEMS vibrator 14 is connected to the output terminal 22 of the inverting amplifier circuit 20 via the capacitor 642.

Therefore, in the example shown in FIG. 6, the first terminal 111 of the MEMS vibrator 11 connected to the inverting amplifier circuit 20 by the connection circuit 30 is connected to the input terminal 21 of the inverting amplifier circuit 20 in an alternating-current manner. Further, in the example shown in FIG. 6, the second terminal 112 of the MEMS vibrator 11 connected to the inverting amplifier circuit 20 by the connection circuit 30 is connected to the output terminal 22 of the inverting amplifier circuit 20 in an alternating-current manner.

Further, in the example shown in FIG. 6, the first terminals of the MEMS vibrators 11 through 14 are connected to the ground potential GND via respective resistors 711, 721, 731, and 741. Further, in the example shown in FIG. 6, the second terminals of the MEMS vibrators 11 through 14 are connected to the power-supply potential VDD as a positive potential via respective resistors 712, 722, 732, and 742.

In the case of using electrostatic MEMS vibrators as the MEMS vibrators 11 through 14, it is required to provide a potential difference between the electrodes constituting the MEMS vibrator. In the example shown in FIG. 6, by supplying the first terminals with a relatively low potential via the resistors 711, 721, 731, and 741, and the second terminals with a relatively high potential via the resistors 712, 722, 732, and 742, a potential difference can be provided between the electrodes constituting each of the MEMS vibrators. Further, since the MEMS vibrator connected to the inverting amplifier circuit 20 by the connection circuit 30 is connected to the inverting amplifier circuit 20 via the capacitors, there is no chance to provide unwanted potential difference between the input terminal 21 and the output terminal 22 of the inverting amplifier circuit 20.

Also in the oscillation circuit 3 according to the third embodiment, substantially the same advantages as in the oscillation circuit 2 according to the second embodiment can be obtained. Further, although the oscillation circuit 3 according to the third embodiment is an oscillation circuit obtained by applying the configuration including the capacitors 611, 612, 621, 622, 631, 632, 641, and 642, and further the configuration including the resistors 711, 712, 721, 722, 731, 732, 741, and 742 to the oscillation circuit 2 according to the second embodiment, it is also possible to apply these configurations to the oscillation circuit 1 according to the first embodiment. In such a case, the oscillation circuit 3 according to the third embodiment provides substantially the same advantages as in the oscillation circuit 1 according to the first embodiment.

4. Oscillation Circuit According to Fourth Embodiment

Figure 7:
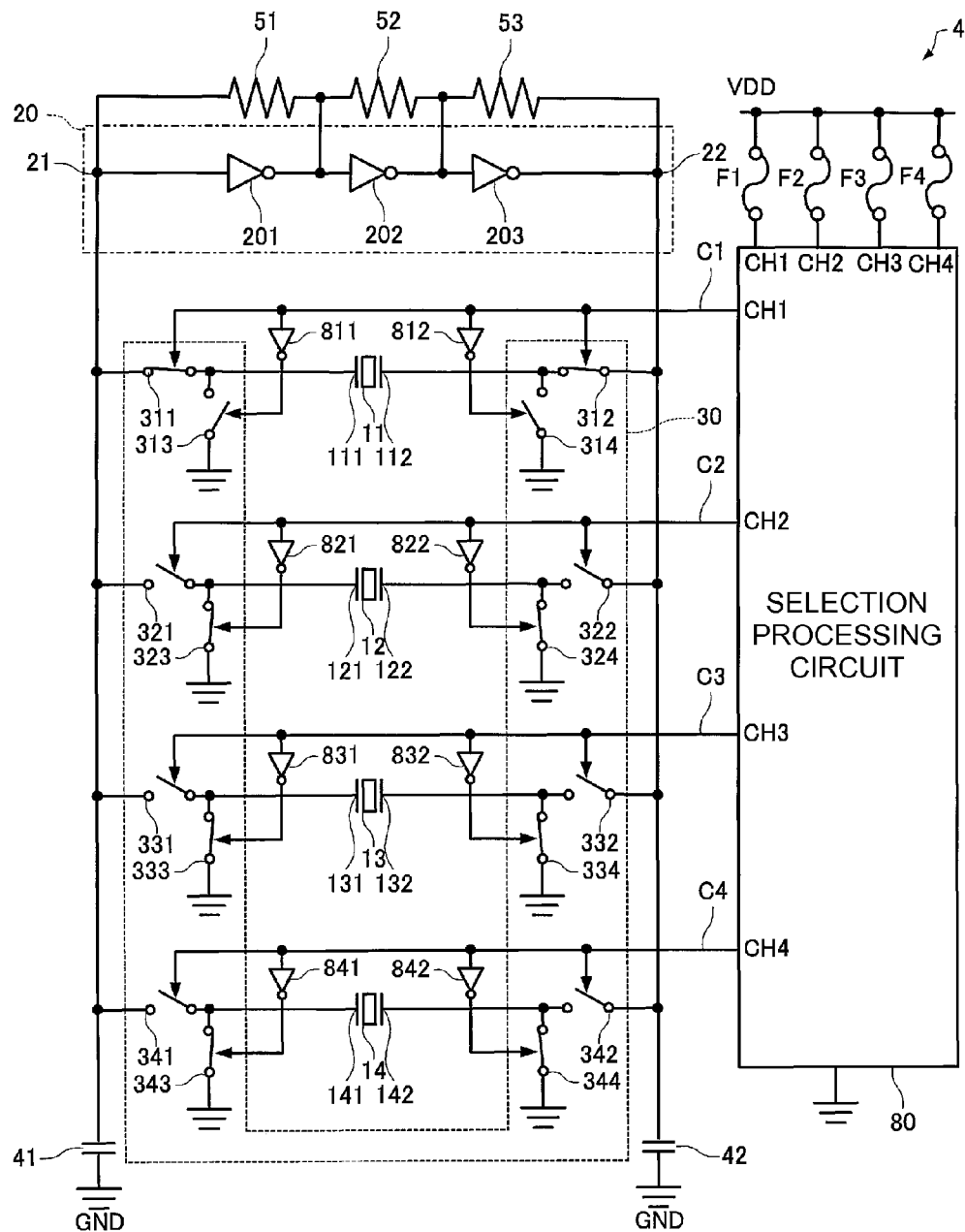
FIG. 7 is a circuit diagram showing an oscillation circuit according to a fourth embodiment of the invention.

FIG. 7 is a circuit diagram showing an oscillation circuit 4 according to a fourth embodiment of the invention. Hereinafter, the constituents different from those of the oscillation circuit 1 according to the first embodiment and the oscillation circuit 2 according to the second embodiment will be described in detail, and the constituents substantially the same as those of the oscillation circuit 1 according to the first embodiment or the oscillation circuit 2 according to the second embodiment will be denoted by the same reference numerals, and the explanation therefor will be omitted.

The oscillation circuit 4 according to the fourth embodiment is configured including a selection processing circuit 80 for performing a process of controlling the connection circuit 30 to thereby select the MEMS vibrator. Hereinafter, the case in which the first switches 311, 321, 331, and 341, the second switches 312, 322, 332, and 342, the third switches 313, 323, 333, and 343, and the fourth switches 314, 324, 334, and 344 are each formed of the analog switch 300 shown in FIG. 2 will be explained as an example.

In the example shown in FIG. 7, the selection processing circuit 80 outputs control signals C1 through C4 to thereby control the connection circuit 30. The arrows shown in FIG. 7 indicate the control signals C1 through C4 to the respective switches.

The control signal C1 is a signal for performing the control related to the MEMS vibrator 11. In the example shown in FIG. 7, the control signal C1 is input to control terminals of the first switch 311 and the second switch 312, and at the same time input to a control terminal of the third switch 313 via an inverter 811, and a control terminal of the fourth switch 314 via an inverter 812. In other words, it is arranged that the connection state of the first switch 311 and the second switch 312, and the connection state of the third switch 313 and the fourth switch 314 are opposite to each other.

The control signal C2 is a signal for performing the control related to the MEMS vibrator 12. In the example shown in FIG. 7, the control signal C2 is input to control terminals of the first switch 321 and the second switch 322, and at the same time input to a control terminal of the third switch 323 via an inverter 821, and a control terminal of the fourth switch 324 via an inverter 822. In other words, it is arranged that the connection state of the first switch 321 and the second switch 322, and the connection state of the third switch 323 and the fourth switch 324 are opposite to each other.

The control signal C3 is a signal for performing the control related to the MEMS vibrator 13. In the example shown in FIG. 7, the control signal C3 is input to control terminals of the first switch 331 and the second switch 332, and at the same time input to a control terminal of the third switch 333 via an inverter 831, and a control terminal of the fourth switch 334 via an inverter 832. In other words, it is arranged that the connection state of the first switch 331 and the second switch 332, and the connection state of the third switch 333 and the fourth switch 334 are opposite to each other.

The control signal C4 is a signal for performing the control related to the MEMS vibrator 14. In the example shown in FIG. 7, the control signal C4 is input to control terminals of the first switch 341 and the second switch 342, and at the same time input to a control terminal of the third switch 343 via an inverter 841, and a control terminal of the fourth switch 344 via an inverter 842. In other words, it is arranged that the connection state of the first switch 341 and the second switch 342, and the connection state of the third switch 343 and the fourth switch 344 are opposite to each other.

In the example shown in FIG. 7, the selection processing circuit 80 is connected to the power-supply potential VDD as a positive potential via fuses F1 through F4. Further, the selection processing circuit 80 is configured so as to output the control signals C1 through C4 based on cutting states of the fuses F1 through F4. It is also possible for the selection processing circuit 80 to output the control signal C1 based on the cutting state of the fuse F1, the control signal C2 based on the cutting state of the fuse F2, the control signal C3 based on the cutting state of the fuse F3, and the control signal C4 based on the cutting state of the fuse F4.

The oscillation circuit 4 according to the fourth embodiment can easily select the MEMS vibrator used in the oscillation circuit 4 by selectively cutting the fuses F1 through F4 in an appropriate manner.

Further, also in the oscillation circuit 4 according to the fourth embodiment, substantially the same advantages as in the oscillation circuit 2 according to the second embodiment can be obtained. Further, although the oscillation circuit 4 according to the fourth embodiment is an oscillation circuit obtained by applying the constituents including the selection processing circuit 80, the inverters 811, 812, 821, 822, 831, 832, 841, and 842, and the fuses F1 through F4 to the oscillation circuit 2 according to the second embodiment, it is also possible to apply these constituents to the oscillation circuit 3 according to the third embodiment. In such a case, the oscillation circuit 4 according to the fourth embodiment provides substantially the same advantages as in the oscillation circuit 3 according to the third embodiment. Further, it is also possible to apply the constituents including the selection processing circuit 80 and the fuses F1 through F4 to the oscillation circuit 1 according to the first embodiment. In such a case, the oscillation circuit 4 according to the fourth embodiment provides substantially the same advantages as in the oscillation circuit 1 according to the first embodiment.

5. Oscillation Circuit According to Fifth Embodiment

Figure 8:
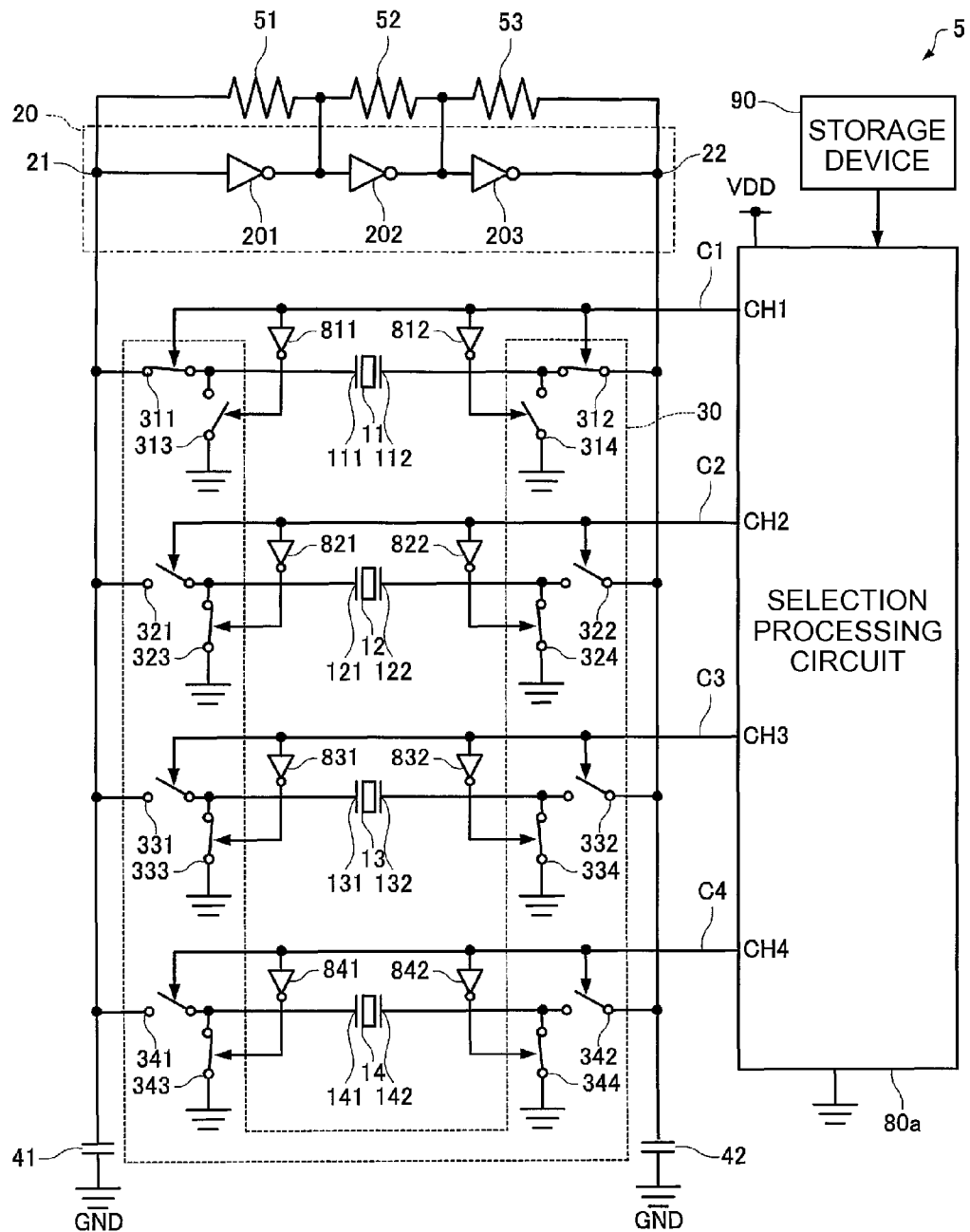
FIG. 8 is a circuit diagram showing an oscillation circuit according to a fifth embodiment of the invention.

FIG. 8 is a circuit diagram showing an oscillation circuit 5 according to a fifth embodiment of the invention. Hereinafter, the constituents different from those of the oscillation circuit 1 according to the first embodiment, the oscillation circuit 2 according to the second embodiment, and the oscillation circuit 4 according to the fourth embodiment will be described in detail, and the constituents substantially the same as those of the oscillation circuit 1 according to the first embodiment, the oscillation circuit 2 according to the second embodiment, or the oscillation circuit 4 according to the fourth embodiment will be denoted by the same reference numerals, and the explanation therefor will be omitted.

The oscillation circuit 5 according to the fifth embodiment is configured including a selection processing circuit 80a for performing a process of controlling the connection circuit 30 to thereby select the MEMS vibrator. Further, the oscillation circuit 5 according to the fifth embodiment is configured including a storage device 90.

The storage device 90 stores "information related to the MEMS vibrator to be selected by the selection processing circuit 80a." The "information related to the MEMS vibrator to be selected by the selection processing circuit 80a" can also be, for example, an identification code corresponding to the MEMS vibrator to be selected by the selection processing circuit 80a, or a combination of values of the control signals C1 through C4. The storage device 90 can also be formed of a nonvolatile memory such as an EEPROM.

The selection processing circuit 80a is configured so as to output the control signals C1 through C4 based on the "information related to the MEMS vibrator to be selected by the selection processing circuit 80a" stored in the storage device 90.

The oscillation circuit 5 according to the fifth embodiment can easily select the MEMS vibrator used in the oscillation circuit 5 by storing the "information related to the MEMS vibrator to be selected by the selection processing circuit 80a" in the storage device 90.

Further, also in the oscillation circuit 5 according to the fifth embodiment, substantially the same advantages as in the oscillation circuit 2 according to the second embodiment can be obtained. Further, although the oscillation circuit 5 according to the fifth embodiment is an oscillation circuit obtained by applying the constituents including the selection processing circuit 80a, the inverters 811, 812, 821, 822, 831, 832, 841, and 842, and the storage device 90 to the oscillation circuit 2 according to the second embodiment, it is also possible to apply these constituents to the oscillation circuit 3 according to the third embodiment. In such a case, the oscillation circuit 5 according to the fifth embodiment provides substantially the same advantages as in the oscillation circuit 3 according to the third embodiment. Further, it is also possible to apply the constituents including the selection processing circuit 80a and the storage device 90 to the oscillation circuit 1 according to the first embodiment. In such a case, the oscillation circuit 5 according to the fifth embodiment provides substantially the same advantages as in the oscillation circuit 1 according to the first embodiment.

6. Method Of Selecting MEMS Vibrator

Figure 9:
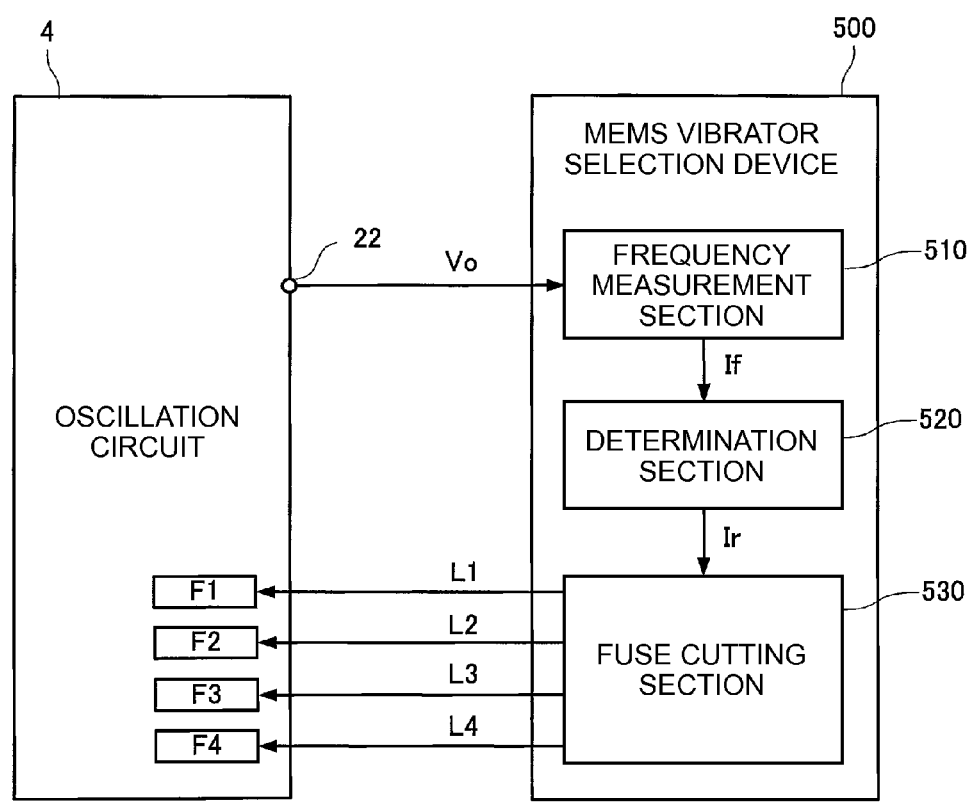
FIG. 9 is a functional block diagram for explaining an example of a method of selecting an MEMS vibrator.

FIG. 9 is a functional block diagram for explaining an example of a method of selecting the MEMS vibrator. In the present section, the case of the oscillation circuit 4 according to the fourth embodiment will be explained as an example. Further, it is assumed that the state in which neither of the fuses F1 through F4 is cut in the oscillation circuit 4 is an initial state, and that the MEMS vibrator 11 is connected to the inverting amplifier circuit 20 by the connection circuit 30 in the initial state. Further, it is assumed that the design value of the resonant frequency of the MEMS vibrator 11 is f1, the design value of the resonance frequency of the MEMS vibrator 12 is f2, the design value of the resonant frequency of the MEMS vibrator 13 is f3, and the design value of the resonance frequency of the MEMS vibrator 14 is f4, and that the magnitude relation of f2<f1<f3<f4 is fulfilled. It should be noted that in the present embodiment the target frequency as the oscillation circuit is a value equal to f1 which is the design value of the resonant frequency of the MEMS vibrator 11. It is preferable to set the values of the frequencies f1 through f4 to the values close to each other to the extent that the accuracy to the target frequency required as the oscillation circuit is fulfilled by selecting either one of the MEMS vibrators 11 through 14 in consideration of, for example, the variation range of the frequency due to the manufacturing variation in the MEMS vibrators 11 through 14.

An MEMS vibrator selection device 500 is a device for determining the MEMS vibrator to be used for oscillation operations in the oscillation circuit 4, and then indirectly or directly controlling the connection circuit 30 to thereby select the MEMS vibrator. In the example shown in FIG. 9, the MEMS vibrator selection device 500 is configured including a frequency measurement section 510, a determination section 520, and a fuse cutting section 530.

The frequency measurement section 510 receives the input of an output signal Vo output from the output terminal 22 of the inverting amplifier circuit 20 of the oscillation circuit 4, and then measures the frequency fo of the output signal Vo. Further, the frequency measurement section 510 outputs frequency information If as the information related to the value of the frequency fo thus measured to the determination section 520.

The determination section 520 receives the input of the frequency information If output by the frequency measurement section 510, and then determines which one of the MEMS vibrators should be selected based on the frequency information If. Further, the determination section 520 outputs determination result information Ir as the information related to the determination result to the fuse cutting section 530.

The fuse cutting section 530 receives the input of the determination result information Ir output by the determination section 520, and then cuts any of the fuses F1 through F4, if necessary, based on the determination result information Ir. In the example shown in FIG. 9, the fuse cutting section 530 is capable of outputting a laser beam L1 for cutting the fuse F1, a laser beam L2 for cutting the fuse F2, a laser beam L3 for cutting the fuse F3, and a laser beam L4 for cutting the fuse F4.

Figure 10:
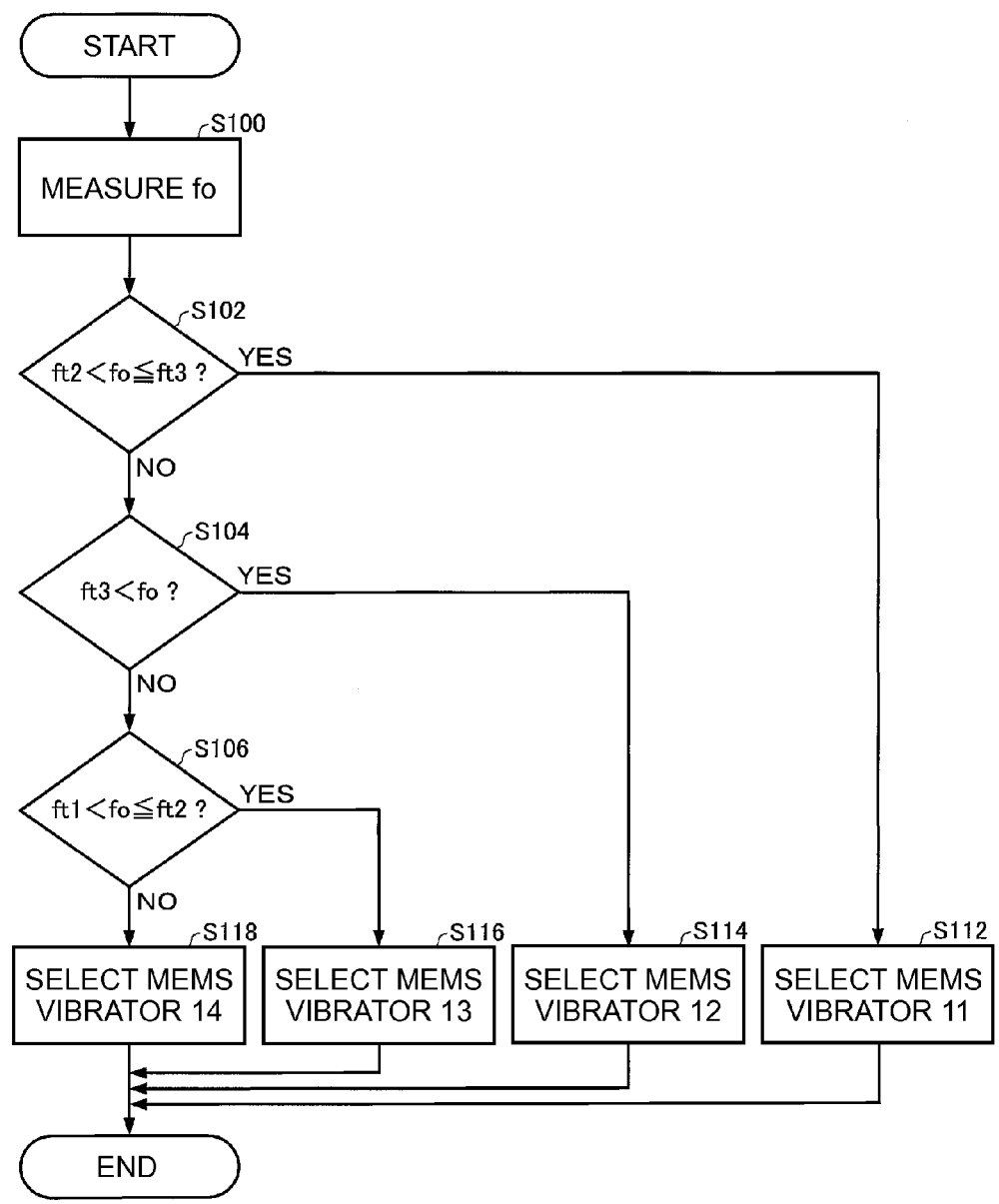
FIG. 10 is a flowchart showing an example of the method of selecting the MEMS vibrator.

FIG. 10 is a flowchart showing an example of the method of selecting the MEMS vibrator. The method of selecting the MEMS vibrator shown in FIG. 10 includes a measurement process for measuring the frequency fo of the output signal Vo of the oscillation circuit 4, a determination process for determining the MEMS vibrator to be selected based on the frequency fo thus measured in the measurement process, and a selection process for controlling the connection circuit 30 of the oscillation circuit 4 to select the MEMS vibrator based on the result of the determination in the determination process.

In the example shown in FIG. 10, it is assumed that threshold frequencies are ft1, ft2, and ft3, and the magnitude relation of ft1<ft2<ft3 is fulfilled. It should be noted that the threshold frequencies ft1, ft2, and ft3 can be set so as to fulfill the magnitude relation of, for example, ft1<f2<ft2<f1<ft3.

In the example shown in FIG. 10, if the magnitude relation of ft2<fo≤ft3 is fulfilled, the MEMS vibrator selection device 500 controls the connection circuit 30 to select the MEMS vibrator 11. Further, if the magnitude relation of ft3<fo is fulfilled, the MEMS vibrator selection device 500 controls the connection circuit 30 to select the MEMS vibrator 12. Further, if the magnitude relation of ft1<fo≤ft2 is fulfilled, the MEMS vibrator selection device 500 controls the connection circuit 30 to select the MEMS vibrator 13. Further, if the magnitude relation of fo≤ft1 is fulfilled, the MEMS vibrator selection device 500 controls the connection circuit 30 to select the MEMS vibrator 14.

In the method of selecting the MEMS vibrator shown in FIG. 10, firstly, the frequency measurement section 510 of the MEMS vibrator selection device 500 receives the output signal Vo output from the output terminal 22 of the inverting amplifier circuit 20 of the oscillation circuit 4, and then measures (step S100, the measurement process) the frequency fo of the output signal Vo. In the present embodiment, after measuring the frequency fo, the frequency measurement section 510 outputs the frequency information If to the determination section 520.

After the measurement process (step S100), the determination section 520 of the MEMS vibrator selection device 500 determines (steps S102 through S106, the determination process) which one of the MEMS vibrators should be selected based on the frequency fo measured in the step S100. In the present embodiment, the determination section 520 determines which one of the MEMS vibrators should be selected based on the frequency information If as the information related to the value of the frequency fo thus measured. Further, the determination section 520 outputs determination result information Ir to the fuse cutting section 530.

After the determination process (steps S102 through S106), the fuse cutting section 530 of the MEMS vibrator selection device 500 controls the connection circuit 30 of the oscillation circuit 4 to select (steps S112 through S118, the selection process) based on the result of the determination in the determination process. In the present embodiment, the fuse cutting section 530 controls the connection circuit 30 of the oscillation circuit 4 to select the MEMS vibrator based on the determination result information Ir output by the determination section 520. Further, in the present embodiment, the fuse cutting section 530 cuts any of the fuses F1 through F4 of the oscillation circuit 4, if necessary, to thereby control the connection circuit 30 indirectly via the selection processing circuit 80 of the oscillation circuit 4 to select the MEMS vibrator.

In the example shown in FIG. 10, after the step S100, the determination section 520 determines (step S102) whether or not the magnitude relation of ft2<fo≤ft3 is fulfilled. If the determination section 520 determines that the magnitude relation of ft2<fo≤ft3 is fulfilled (YES in the step S102), the fuse cutting section 530 controls the connection circuit to select (step S112) the MEMS vibrator 11. More specifically, the fuse cutting section 530 outputs neither of the laser beams L1 through L4. Thus, the oscillation circuit 4 keeps the initial state to thereby set the state (i.e., the state of selecting the MEMS vibrator 11) in which the MEMS vibrator 11 is connected to the inverting amplifier circuit 20 by the connection circuit 30.

If the determination section 520 determines in the step S102 that the magnitude relation of ft2<fo≤ft3 is not fulfilled (NO in the step S102), the determination section 520 determines (step S104) whether or not the magnitude relation of ft3<fo is fulfilled. If the determination section 520 determines that the magnitude relation of ft3<fo is fulfilled (YES in the step S104), the fuse cutting section 530 controls the connection circuit 30 to select (step S114) the MEMS vibrator 12. More specifically, the fuse cutting section 530 outputs the laser beam L1 to cut the fuse F1, and at the same time, outputs the laser beam L2 to cut the fuse F2. Thus, the connection state of the first switches 311 and 321, the second switches 312 and 322, the third switches 313 and 323, and the fourth switches 314 and 324 is switched to thereby set the state (i.e., the state of selecting the MEMS vibrator 12) in which the MEMS vibrator 12 is connected to the inverting amplifier circuit 20 by the connection circuit 30.

If the determination section 520 determines in the step S104 that the magnitude relation of ft3<fo is not fulfilled (NO in the step S104), the determination section 520 determines (step S106) whether or not the magnitude relation of ft1<fo≤ft2 is fulfilled. If the determination section 520 determines that the magnitude relation of ft1<fo≤ft2 is fulfilled (YES in the step S106), the fuse cutting section 530 controls the connection circuit 30 to select (step S116) the MEMS vibrator 13. More specifically, the fuse cutting section 530 outputs the laser beam L1 to cut the fuse F1, and at the same time, outputs the laser beam L3 to cut the fuse F3. Thus, the connection state of the first switches 311 and 331, the second switches 312 and 332, the third switches 313 and 333, and the fourth switches 314 and 334 is switched to thereby set the state (i.e., the state of selecting the MEMS vibrator 13) in which the MEMS vibrator 13 is connected to the inverting amplifier circuit 20 by the connection circuit 30.

If the determination section 520 determines in the step S106 that the magnitude relation of ft1<fo≤ft2 is not fulfilled (NO in the step S106), the fuse cutting section 530 controls the connection circuit 30 to select (step S118) the MEMS vibrator 14. More specifically, the fuse cutting section 530 outputs the laser beam L1 to cut the fuse F1, and at the same time, outputs the laser beam L4 to cut the fuse F4. Thus, the connection state of the first switches 311 and 341, the second switches 312 and 342, the third switches 313 and 343, and the fourth switches 314 and 344 is switched to thereby set the state (i.e., the state of selecting the MEMS vibrator 14) in which the MEMS vibrator 14 is connected to the inverting amplifier circuit 20 by the connection circuit 30.

After either one of the selection processes (the steps S112 through S118), all of the processes of the method of selecting the MEMS vibrator are terminated.

As described above, by determining the MEMS vibrator to be selected based on the frequency fo of the output signal Vo of the oscillation circuit 4 in the initial state and then directly or indirectly controlling the connection circuit 30 to thereby select the MEMS vibrator, the MEMS vibrator with which the output signal Vo becomes to have the desired frequency can easily be selected. Therefore, the oscillation circuit with a suppressed variation in the oscillation frequency can be realized.

7. Configuration Example of MEMS Vibrator

Figure 11:
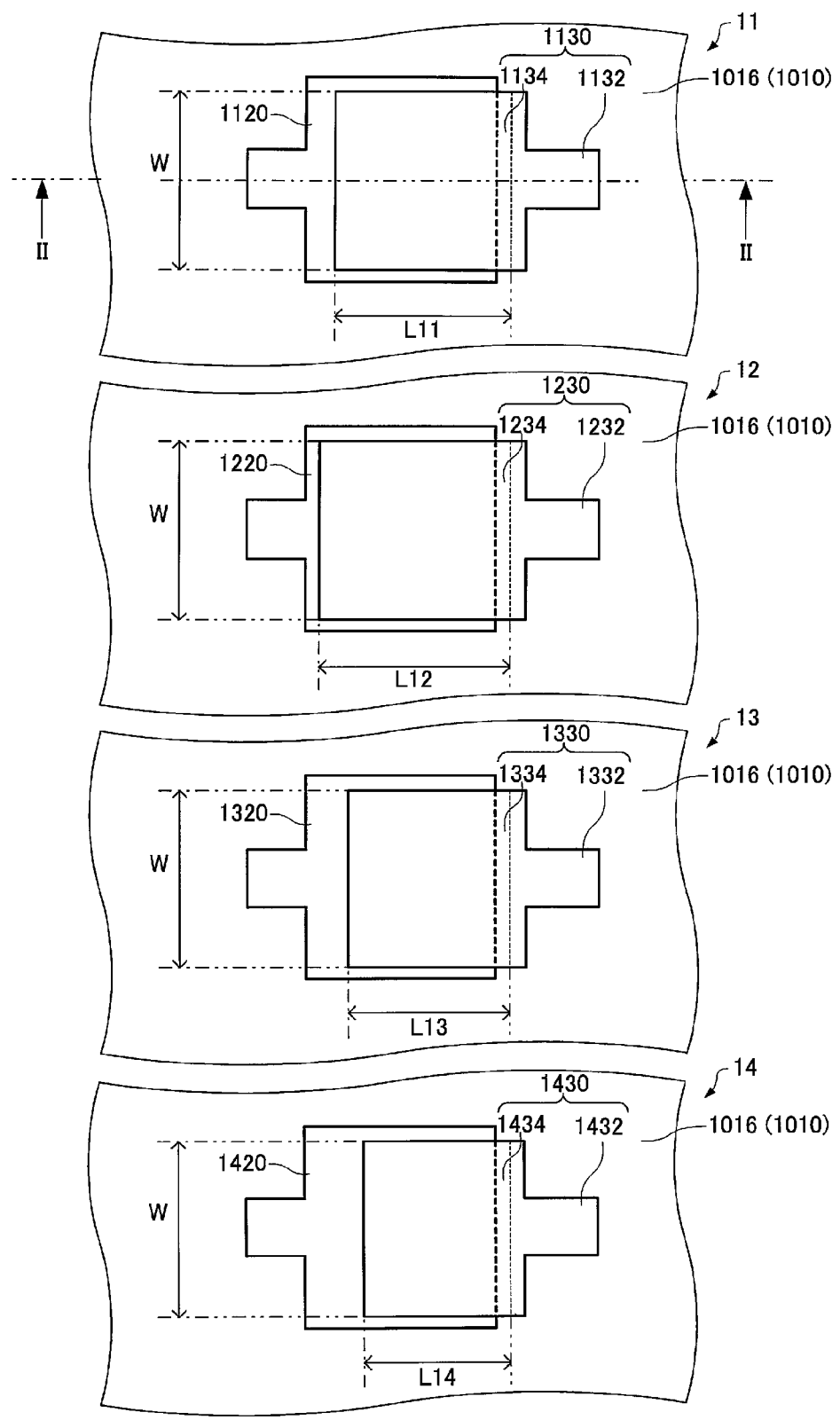
FIG. 11 is a plan view schematically showing configuration examples of the MEMS vibrators.
Figure 12:
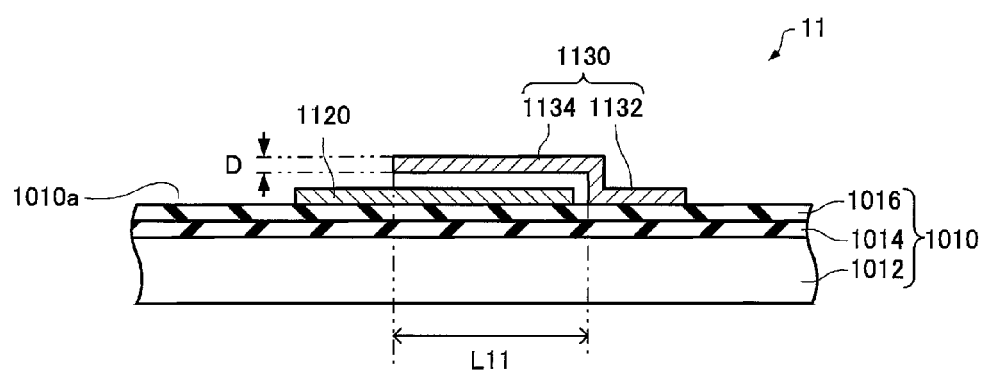
FIG. 12 is a cross-sectional view schematically showing a configuration example of the MEMS vibrator.

FIG. 11 is a plan view schematically showing configuration examples of the MEMS vibrators 11 through 14. FIG. 12 is a cross-sectional view schematically showing the configuration example of the MEMS vibrator 11. It should be noted that FIG. 12 is a cross-sectional view along the II-II line shown in FIG. 11.

It should be noted that in the descriptions according to the present embodiment, in the case of using the term "above" in such a phrase as "a specific object (hereinafter referred to as "B") is formed "above" another specific object (hereinafter referred to as "A")," the term "above" is used intending to include both of the case of forming B directly on A and the case of forming B indirectly on A via another object.

As shown in FIG. 11, the MEMS vibrator 11 is configured including a first electrode 1120 and a second electrode 1130 disposed above a substrate 1010. The MEMS vibrator 12 is configured including a first electrode 1220 and a second electrode 1230 disposed above the substrate 1010. The MEMS vibrator 13 is configured including a first electrode 1320 and a second electrode 1330 disposed above the substrate 1010. The MEMS vibrator 14 is configured including a first electrode 1420 and a second electrode 1430 disposed above the substrate 1010.

As shown in FIG. 12, the substrate 1010 can include a support substrate 1012, a first foundation layer 1014, and a second foundation layer 1016.

As the support substrate 1012, a semiconductor substrate such as a silicon substrate can be used. As the support substrate 1012, it is also possible to use various substrates such as a ceramic substrate, a glass substrate, a sapphire substrate, a diamond substrate, or a synthetic resin substrate.

The first foundation layer 1014 is formed above (more specifically, on the support substrate 1012) the support substrate 1012. As the first foundation layer 1014, there can be used, for example, a trench insulating layer, an LOCOS (local oxidation of silicon) insulating layer, and a semi-recess LOCOS insulating layer. The first foundation layer 1014 is capable of electrically isolating the MEMS vibrators 11 through 14 and other elements (not shown) formed above the support substrate 1012 from each other.

The second foundation layer 1016 is formed on the first foundation layer 1014. As the material of the second foundation layer 1016, there can be cited, for example, silicon nitride.

Since the basic configurations of the MEMS vibrators 11 through 14 are substantially the same, in the explanation described below, the explanation will be presented with a focus on the constituents of the MEMS vibrator 11, and the reference numerals corresponding to the constituents of the MEMS vibrators 12 through 14 are sequentially described in the parentheses.

The first electrode 1120 (1220, 1320, 1420) of the MEMS vibrator 11 (12, 13, 14) is formed on the substrate 1010. The shape of the first electrode 1120 (1220, 1320, 1420) is, for example, a layer or a thin-film shape.

The second electrode 1130 (1230, 1330, 1430) of the MEMS vibrator 11 (12, 13, 14) is formed having an interval with the first electrode 1120 (1220, 1320, 1420). The second electrode 1130 (1230, 1330, 1430) has a support section 1132 (1232, 1332, 1432) formed on the substrate 10 and a beam section 1134 (1234, 1334, 1434) supported by the support section 1132 (1232, 1332, 1432) and disposed above the first electrode 1120 (1220, 1320, 1420). The support section 1132 (1232, 1332, 1432) is disposed so as to be opposed to the first electrode 1120 (1220, 1320, 1420) with a space. The second electrode 1130 (1230, 1330, 1430) is formed to have a cantilever shape.

When a voltage is applied between the first electrode 1120 (1220, 1320, 1420) and the second electrode 1130 (1230, 1330, 1430), the beam section 1134 (1234, 1334, 1434) can vibrate due to the electrostatic force generated between the electrodes 1120 (1220, 1320, 1420) and 1130 (1230, 1330, 1430). In other words, the MEMS vibrators 11 through 14 shown in FIGS. 11 and 12 are each an electrostatic MEMS vibrator. It should be noted that it is also possible for the MEMS vibrator 11 (12, 13, 14) to have a coated structure for airtightly sealing the first electrode 1120 (1220, 1320, 1420) and the second electrode) 130 (1230, 1330, 1430) in a reduced-pressure state. Thus, the air resistance in the vibration of the beam section 1134 (1234, 1334, 1434) can be reduced.

As the material of the first electrode 1120 (1220, 1320, 1420) and the second electrode 1130 (1230, 1330, 1430), there can be cited, for example, polycrystalline silicon provided with electrical conductivity by doping predetermined impurities.

The MEMS vibrators 11 through 14 can be configured so that the respective beam sections 1134, 1234, 1334, and 1434 have the same thickness D. Further, the MEMS vibrators 11 through 14 can be configured so that the respective beam sections 1134, 1234, 1334, and 1434 have the same width W. According to these configurations, it is possible to control the resonant frequencies of the MEMS vibrators 11 through 14 by the lengths L11, L12, L13, and L14 of the beam sections 1134, 1234, 1334, and 1434, respectively.

The longer the lengths L11, L12, L13, and L14 of the beam sections 1134, 1234, 1334, and 1434 are, the lower the resonant frequency of the MEMS vibrators 11 through 14 become, and the shorter the lengths L11, L12, L13, and L14 of the beam sections 1134, 1234, 1334, and 1434 are, the higher the resonant frequency of the MEMS vibrators 11 through 14 become. As shown in FIG. 11, in the present embodiment, the beam sections 1134, 1234, 1334, and 1434 are configured so that the magnitude relation of $L14<L13<L11<L12$ is fulfilled. Therefore, the resonant frequencies f1 through f4 of the MEMS vibrators 11 through 14 fulfills the magnitude relation of $f2<f1<f3<f4$.

As shown in FIG. 11, the MEMS vibrators 11 through 14 are formed on the same substrate 1010. Further, the MEMS vibrators 11 through 14 can be formed on the same substrate 1010 in the same manufacturing process. Thus, the direction (the tendency of becoming greater or smaller than the design value) of the resonant frequency shift due to variation in manufacture normally becomes the same between the MEMS vibrators 11 through 14, and therefore, the magnitude relation between the resonant frequencies of the MEMS vibrators 11 through 14 is maintained. Therefore, it is possible to more surely select the MEMS vibrator with the resonant frequency closer to the target frequency of the oscillation circuit.

It should be noted that as the MEMS vibrators 11 through 14, various MEMS vibrators known to the public can be adopted besides the configuration described above.

It should be noted that the embodiments and the modified examples described above are each nothing more than an example, and the invention is not limited thereto. For example, it is possible to arbitrarily combine the embodiments and the modified examples described above.

The invention is not limited to the embodiments described above, but further various modifications are possible. For example, the invention includes configurations (e.g., configurations having the same function, the same way, and the same result, or configurations having the same object and the same advantage) substantially the same as those described in the embodiment section. Further, the invention includes configurations obtained by replacing a non-essential part of the configurations described in the embodiment section. Further, the invention includes configurations providing the same functions and the same advantages or configurations capable of achieving the same object as the configurations described in the embodiment section. Further, the invention includes configurations obtained by adding technologies known to the public to the configurations described in the embodiment section.

The entire disclosure of Japanese Patent Application No. 2011-059214, filed Mar. 17, 2011 is expressly incorporated by reference herein.

What is claimed is:

1. An oscillation circuit comprising:
a plurality of MEMS vibrators each having a first terminal and a second terminal, and having respective resonant frequencies different from each other;
an amplifier circuit having an input terminal and an output terminal; and
a connection circuit adapted to connect the first terminal of one of the MEMS vibrators and the input terminal to each other, and the second terminal of the one of the MEMS vibrator and the output terminal to each other to thereby connect the one of the MEMS vibrators and the amplifier circuit to each other, wherein
the connection circuit connects the first terminal and the second terminal of the MEMS vibrator, which fails to be connected to the amplifier circuit, to a first reference potential.

2. The oscillation circuit according to claim 1, wherein the connection circuit includes at least one of
a first switch adapted to switch a connection state between the first terminal of each of the MEMS vibrators and the input terminal, and
a second switch adapted to switch a connection state between the second terminal of each of the MEMS vibrators and the output terminal.

3. The oscillation circuit according to claim 2, wherein the connection circuit includes
the first switch, and
the second switch.

4. The oscillation circuit according to claim 1, wherein the connection circuit includes
a third switch adapted to switch a connection state between the first terminal of the MEMS vibrator, which fails to be connected to the amplifier circuit, and the first reference potential, and
a fourth switch adapted to switch a connection state between the second terminal of the MEMS vibrator, which fails to be connected to the amplifier circuit, and the first reference potential.

5. The oscillation circuit according to claim 1, further comprising:
a first capacitor connected between the input terminal and a second reference potential; and
a second capacitor connected between the output terminal and the second reference potential.

6. An oscillation circuit comprising:
a plurality of MEMS structures each having a first terminal and a second terminal, and having respective resonant frequencies in a resonant state different from each other; and
an amplifier circuit having an input terminal and an output terminal,
wherein the first terminal of one of the MEMS structures and the input terminal are connected to each other,
the second terminal of the one of the MEMS structures and the output terminal are connected to each other,
the first terminal of the other of the MEMS structures and the input terminal fail to be connected to each other,
the second terminal of the other of the MEMS structures and the output terminal fail to be connected to each other, and
the first terminal of the other of the MEMS structures and the second terminal of the other of the MEMS structures are connected to a first reference potential.

7. The oscillation circuit according to claim 6, further comprising:
a first capacitor connected between the input terminal and a second reference potential; and
a second capacitor connected between the output terminal and the second reference potential.

8. The oscillation circuit according to claim 6, wherein the input terminal is a terminal having a function of inputting a signal to the amplifier circuit, and
the output terminal is a terminal having a function of outputting a signal amplified by the amplifier circuit.

9. The oscillation circuit according to claim 6, wherein the first terminal is a terminal having a function of outputting a signal generated due to a resonance of the MEMS structure, and
the second terminal is a terminal having a function of feeding back the signal amplified by the amplifier circuit to the MEMS structure.

* * * * *